United States Patent [19]

Madwed

[11] 4,203,360
[45] May 20, 1980

[54] METHOD FOR SILK-SCREEN PRINTING

[76] Inventor: Steven R. Madwed, 11 Woody La., Fairfield, Conn. 06430

[21] Appl. No.: 794,064

[22] Filed: May 5, 1977

[51] Int. Cl.² .............................................. B41N 1/24
[52] U.S. Cl. ................................ 101/129; 101/128.21
[58] Field of Search ......................... 101/128.3, 128.4; 355/77, 79, 132; 96/30, 27 R, 23, 41, 36.2, 36.3, 36.4, 14

[56] References Cited

U.S. PATENT DOCUMENTS

| | | | |
|---|---|---|---|
| 1,785,997 | 12/1930 | Blecher | 96/30 |
| 2,223,008 | 11/1940 | Michaelis | 96/23 X |
| 2,446,112 | 7/1948 | Simmon et al. | 96/14 X |
| 2,691,917 | 10/1954 | Curry | 96/23 X |
| 2,787,543 | 4/1957 | Murray et al. | 96/14 |
| 3,326,682 | 6/1967 | Endermann et al. | 96/30 X |
| 3,746,540 | 7/1973 | Rarey | 101/128.3 X |
| 3,796,575 | 3/1974 | Kirsch | 96/14 |
| 3,913,477 | 10/1975 | Howland et al. | 96/30 X |
| 3,969,115 | 7/1976 | Savia | 96/14 |

*Primary Examiner*—Edgar S. Burr
*Assistant Examiner*—A. Heinz
*Attorney, Agent, or Firm*—Johnson & Kline

[57] ABSTRACT

There is disclosed herein a method of previsualization and making of a multicolored enlargement by silk screen printing from a subject photographic transparency, preferably a negative, which includes the steps of (1) making a plurality of small trial transparencies of images of graduated intensities of the subject transparency; (2) making a plurality of full size transparencies of graduated intensities corresponding to the trial transparencies on a scale intended for the finished work; (3) making from the small transparencies a plurality of strips of trial transparencies, each strip being silk screen printed preferably in one of the colors intended for use in the finished work, and each strip having images having graduated intensities of exposure; (4) over a light source superposing and viewing the images of said colored trial strips in various superposed relations; (5) selecting one or more superpositions for hybridization if so desired; (6) repeating steps 1, 2 and 3 for the hybrid choices; (7) selecting trial transparencies having a desired color and intensity; (8) using said full size transparency having the intensity of the selected trial transparency to make a full size silk screen; (9) printing with a color medium corresponding to the color of the selected colored trial transparency with said full size silk screen on a foundation sheet for the finished work which may be more or less opaque or transparent for viewing in a light box; (10) repeating steps 7, 8 and 9 for each of the colors to be used in the finished work; and (11) using above listed techniques for non-graduated images with various areas of trial transparencies having different colors to allow choice in previsualization.

9 Claims, 4 Drawing Figures

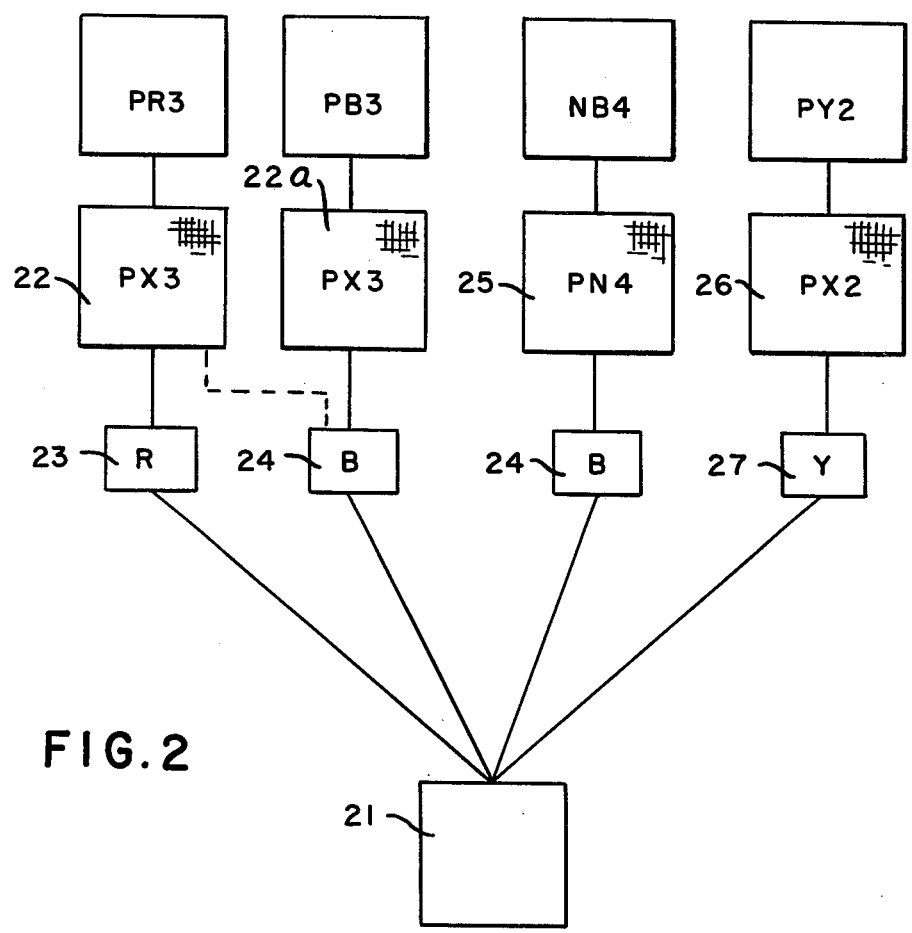
FIG. 2
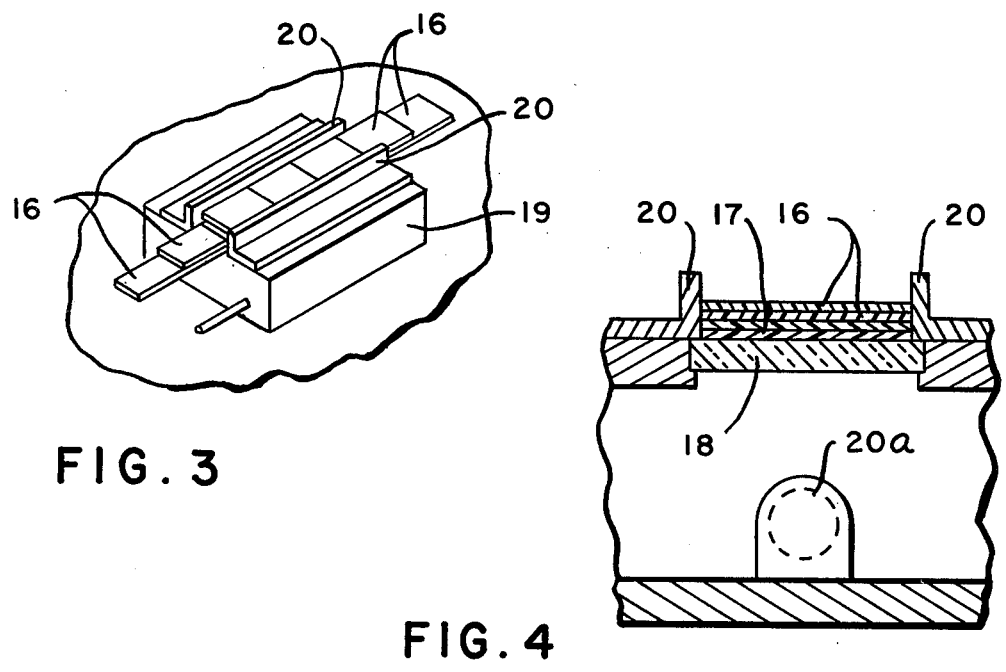
FIG. 3
FIG. 4

METHOD FOR SILK-SCREEN PRINTING

This invention relates to the art of making from a subject photographic transparency, multicolored silk-screen prints.

An object of this invention is to substantially reduce the cost and effort heretofore involved in producing multicolored silk-screen prints and to facilitate the making of colored prints which are aesthetically and artistically desirable.

Heretofore when it was desired to make silk-screen prints photographically, the artist used his judgment and skill to determine the placement and colors to be used. Any judgment error necessitated the discarding of the print.

Another method used by silk screeners involved the printing out of a given color a number of times (ten as an example). Then the printing of a few other colors over the first printing. Then a third group of colors over the second and so on until all images are complete resulting in ten differently colored images.

To produce a satisfactory image, the above two methods involve the loss of a substantial amount of time, effort and material without fully exploring the options available to the artist. The problem is avoided by practicing the present invention which enables the artist to use his artistry and skill to choose the most desirable result from a multiplicity of combinations of colors an intensities. This result may be opaque or translucent depending on the character of the ink applied and the foundation on which the colors are printed.

This is accomplished by the method of the present invention by making a series of imaged trial transparencies on a scale substantially smaller than that of the final silk-screen print to be made, one transparency for each color to be used, each series including transparencies having progressively different intensities, i.e., exposure times. After the trial transparencies are made, the larger full size duplicates are made on a scale intended for the final silk-screen print. These large duplicates are made in positive and negative form and are set aside until the colors and intensities to be used are chosed by preparation and use of the trial transparencies.

The trial transparencies having images of varying intensities for each color to be used are formed on an elongate transparent strip evenly spaced and in use some or all of these strips are superposed over a source of light and viewed by the artist who may rearrange the superposition of the images on the strips until the desired artistic effect as to intensity and color has been obtained.

By making the transparencies in the various colors and intensities, a great many pleasing combinations may be made of the subject transparency. The trial transparencies are preferably coded to identify their color, intensity and form (positive and negative) to aid in the preparation of the full size transparencies.

If the artist so desires, hybrids may be produced from the trial transparencies of different intensities. When positive and negative black opaque strips of the same intensity are superposed over a light source, no light would come through the image. By offsetting one strip of one or more intensities from the other, an image would appear between the positive and negatives termed a "line image." The resulting line image could be contact printed or photographed in positive and negative forms, and then treated as new images to be previsualized. This process can be repeated time after time if desired and thus further abstract an image into thousands of component parts.

When one or more combination of colors and intensities has been chosen by the artist, the previously made full size transparencies corresponding to the images viewed with approval are used to make silk screens for use in printing full size prints with the color of each medium indicated by the code of the trial transparency.

Other features and advantages will hereinafter appear.

In the accompanying drawings:

FIG. 2 shows the steps involved in making the final print.

FIG. 3 is a perspective view of an illuminted viewing box.

FIG. 4 is a transverse section of the box shown in FIG. 3.

Figure 1:
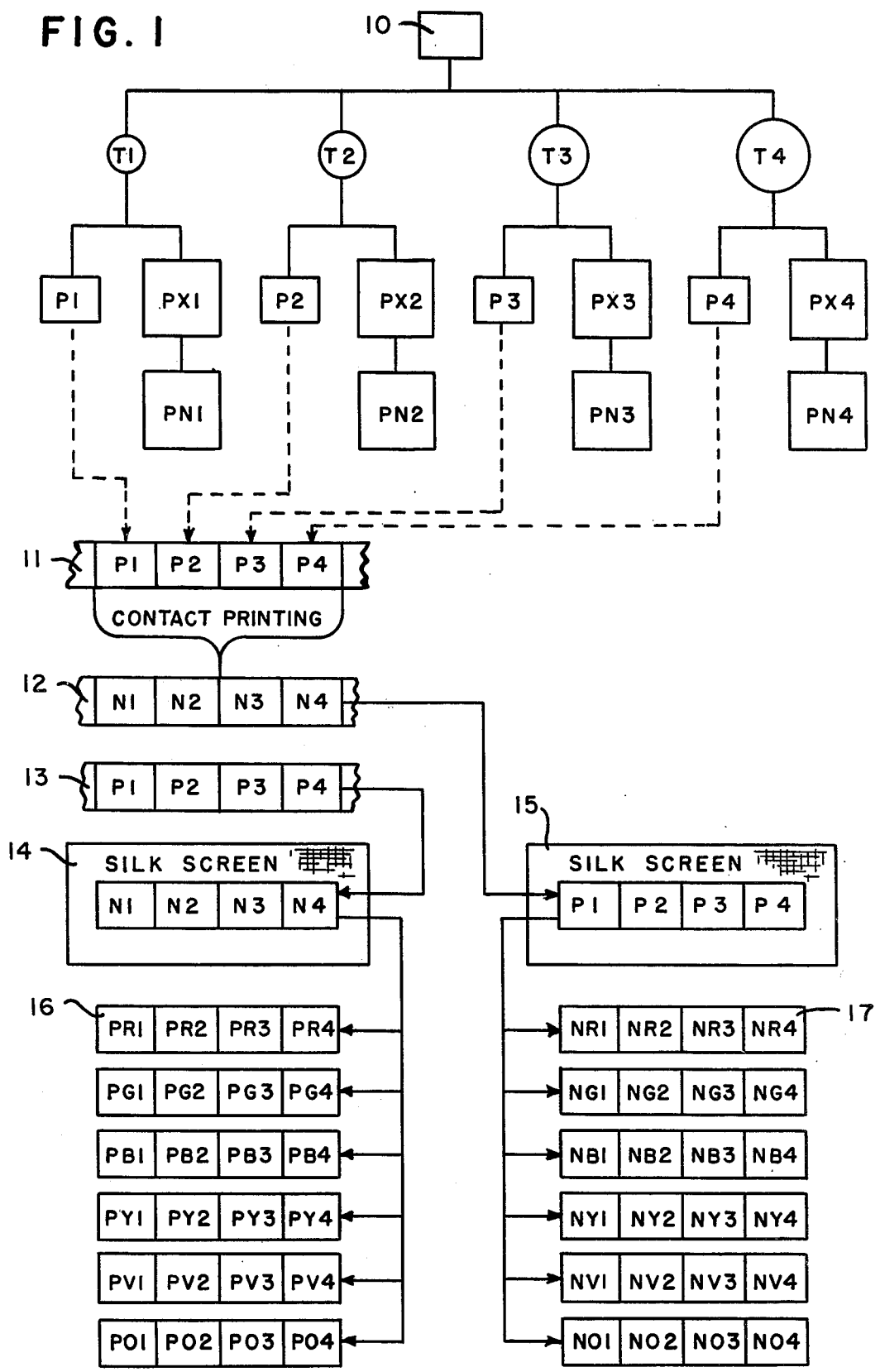
FIG. 1 is a diagrammatic view showing the various transparencies involved in the present invention up to the steps in making of the final print.

Referring to FIG. 1, the transparency 10 of the subject to be printed may be in positive or negative form, but to simplify the explanation, will be considered to be in negative form. It is exposed for a plurality of gradually changing periods of time T1, T2, T3 and T4, in the example given, to make in strip form a series of positive photographic trial transparencies P1, P2, P3 and P4 which can be in the order of 8×8 cm. Also using the subject transparency 10 a series of like exposures PX1, PX2, PX3 and PX4 may be made of the size intended for the final print having intensities corresponding to those of the trial transparencies P1, P2, P3 and P4.

The artist will make as many transparencies of different intensities as he desires depending on the intricacy of the completed final print, four intensities being referred to herein by way of example.

Optionally, at the same time a series of full size transparencies PN1, PN2, PN3 and PN4 may be made in negative form by being contact printed, for instance, from the transparencies PX1, PX2, PX3 and PX4. The full size negative and positive transparencies are set aside for use after the evaluations have been made of the images on the small transparencies P1, P2, P3 and P4.

The next step in the method of this invention is to mount the transparencies P1, P2, P3 and P4 on a strip 11 of film or other transparent material and with this contact print a transparent strip 12 in negative images N1, N2, N3 and N4 having the four different intensities. A positive strip 13 having images P1, P2, P3 and P4 is made from the strip 12.

Then one negative silk screen 14 is made from the positive strip 13 and a positive silk screen 15 is made from the negative strip 12. Using the negative silk screen 14 there is made a plurality of positive trial strips 16, one such strip being printed with ink which is one of the colors of the printing media to be used in making the final print, there being six colors in the example shown and six positive imaged colored transparent strips 16.

Using the positive silk screen 15, six colored transparent negative trial strips 17 are printed in like manner as the positive imaged colored strips 16.

To aid the artist in identifying the transparencies in the selection which is to be made, each of the trial transparencies is provided with a coded designation as to form (negative or positive), intensity of the image and the color or hue thereof. In one form of identification such as used herein, the intensities of the images are identified by numerals 1, 2, 3 and 4, the negative form by the letter N, the positive form by the letter P and the full size positive and negatives being designated by the addition of the letter X.

After the strips 16 and 17 have been made, they are superposed on each other and are placed on a transparent plate 18 of a viewing stand 19 provided with suitable lighting means 20a shown in FIG. 4 by way of example. The strips 16 and 17 of the colored images which are superposed with the images in depthwise registration are shifted longitudinally with relation to each other and observed by the artist until the desired optical effect is obtained. This operation may be facilitated by lateral guides 20 provided on the viewing stand 19. During this operation some of the strips 16 and 17 may be set aside as not needed to produce the artistic effect desired.

Assuming that the first color to be printed on the final foundation sheet 21 (FIG. 2) is identified by the code designation PR3, indicating that the image is to be in positive form with the color red and an intensity of three, the artist would select the imaged full size transparency PR3 (FIG. 2) and make a silk screen 22 (PX3) therefrom. Using that silk screen 22 the foundation sheet 21 would be printed with the red printing medium 23. If the next color to be used is blue with the same intensity and form as above, the silk screen 22 which was used for the red printing medium 23 may be cleaned and then used with the blue printing medium 24 to print the final foundation sheet 21. However, instead of cleaning the silk screen 22 as indicted by the dotted line in FIG. 2, the artist may make another silk screen 22a from the transparency PB3 and use it with the blue printing medium to print the final work 21.

If the next image called for is NB4, the artist would make or, if made, take a full size silk screen 25 using the full size negative transparency PN4 and this would be used to print the foundation sheet 21 with blue printing medium 24. If, as in the example illustrated, the next selected transparency is PY2, the transparency PY2 would be used to make a silk screen 26 and this would be used with yellow printing medium 27 to print the foundation sheet 21. These steps would be repeated for each of the monochromatic colors to be used.

It will be apparent that with variables as to form, i.e., positive and negative, four variables, for instance, in the degrees of intensity, and six different colors, a great many variations of the photographic original may be made with comparatively little effort, time and expense.

At any time during the viewing operation hybrids may be chosen for contact printing or photographing in positive or negative and used as additional images for the previsualization process.

The words "negative transparency" as used herein are intended to connote a transparency in which light objects in the natural form appear dark on the transparency.

Variations and modifications may be made within the scope of the claims and portions of the improvements may be used without others.

I claim:

1. A method of making a multicolor silk screen print of a subject transparency of an image which includes the step of exposing said subject transparency for a plurality of time periods to make a series of trial transparencies of different intensities corresponding to the exposed time period, assemblying said trial transparencies of varying intensity onto a film strip, forming a negative transparency strip and a positive transparency strip of said trial transparency on said film strip, making a plurality of monochromatic color trial transparencies strips from each of said negative and positive transparency strips by silk screen printing wherein each of said color trial transparency strips has thereon a plurality of image of varying intensities of like monochromatic color formed thereon, and superposing said negative color transparency trial strips and positive color transparency trial strips on one another for viewing any combination of superimposed images thereon to form a desired composition of said superposed images.

2. A method of making a multicolored enlarged print from a subject transparency of an image which includes the steps of making from the subject transparency a plurality of transparency strips each of which contain a plurality of relatively small transparencies of said image in varying intensities; screen printing one trial strip for each selective color to be used in printing a desired color print wherein each trial strip includes a plurality of monochromatic images of graduated intensities thereon; superposing said trial strips containing said monochromatic images of graduated intensities over a source of light with the images of the respective trial strips in depthwise registrations; shifting the trial strips respectively longitudinally relative to one another until the images of the desired intensities and color are brought into registration to form a desired composition formed of said superposed images; noting the intensities and color of the respective images forming the desired composition; making from the subject transparency a series of enlargements corresponding to the size of the multicolored print to be made wherein each enlargement has the intensity of the respective trial transparency forming the desired composition, using said enlargements to make a corresponding sized screen which correspond to the respective intensity of said superposed transparency images forming the desired composition; and printing the appropriate color through the respective screens to form a print of said desired composition; in which the steps of making said plurality of trial strips having a plurality of monochromatic transparencies includes the steps of making from the subject transparency a plurality of individual transparencies of varying intensities, assemblying said individual transparencies of varying intensities on a transparent foundation strip, making a contact print of said assembled transparencies, using said contact print to make a screen, and with said screen making said plurality of monochromatic trial transparencies of varying intensities corresponding to said trial transparencies.

3. A method of making a multicolored print of a subject transparency of an image which includes the step of exposing said subject transparency for a plurality of time periods to make a series of trial transparencies of different intensities corresponding to the exposed time period, assemblying said trial transparencies of varying intensities onto a film strip, forming a negative transparency strip and a positive transparency strip from said trial transparency film strip; making a screen of each of said negative and positive transparency strips; making a plurality of monochromatic color trial transparency strips from each of said screens by printing through said screen the appropriate color media wherein each of the trial transparency strips has thereon a plurality of images of varying intensities of like monochromatic color thereon; and superposing said trial transparency strips one on the other for viewing any combination of superimposed images thereon to form a desired composition of said superimposed images.

4. The method as defined in claim 3 and including the steps of making a full scale duplicate of each subject transparency in both negative and positive form and having a like intensity corresponding to that of said subject transparency.

5. The method as defined in claim 4 and including the steps of forming a full scale screen from the appropriate full scale duplicate corresponding in size to said print and to the polarity and intensity of the respective trial transparencies making up the desired composition of said image, and successively screen printing the appropriate color onto a foundation sheet through said full scale screen which corresponds to the polarity and intensity of the superposed trial transparencies of said desired composition.

6. A method of making a multicolored enlarged print from a subject transparency of an image which includes the steps of making from the subject transparency a plurality of transparency strips each of which contain a plurality of relatively small transparencies of said image in varying intensities; screen printing one trial strip for each selective color to be used in printing a desired color print wherein each trial strip includes a plurality of monochromatic images of graduated intensities thereon; superposing said trial strips containing said monochromatic images of graduated intensities over a source of light with the images of the respective trial strips in depthwise registrations; shifting the trial strips respectively longitudinally relative to one another until the images of the desired intensities and color are brought into registration to form a desired composition formed of said superposed images; noting the intensities and color the respective images forming the desired composition; making from the subject transparency a series of enlargements corresponding to the size of the multicolored print to be made wherein each enlargement has the intensity of the respective trial transparency forming the desired composition, using said enlargements to make a corresponding sized screen which correspond to the respective intensity of said superposed transparency images forming the desired composition; and printing the appropriate color through the respective screens to form a print of said desired composition; in which said step, which includes the making of said plurality of trial strips of relatively small monochromatic transparencies includes making from the subject transparency a plurality of individual transparencies having the images of graded intensities; attaching said individual transparencies to a first transparent strip and contact printing a second transparent strip from said first transparent strip; making a third transparent strip from the second strip; one of said second and third strips having its images in negative form and the other in positive form; and using the second and third strips to make two silk screens, one in positive form and the other in negative form, for use in making said plurality of trial strips of relatively small monochromatic transparencies, one strip in each color to be used in making said enlargement.

7. A method of previsualizing an image and of making a multicolor screen print of said previsualized image comprising the steps of making a photo transparency of an image, exposing said photo transparency for a plurality of gradually different time periods to make a series of trial transparencies making a full scale duplicate of each said trial transparencies in both negative and positive form and having like intensity of said trial transparencies to correspond in size to said enlarged print; taking said trial transparencies and making said trial transparencies in a negative strip form and positive strip form wherein each said strip form includes a plurality of images of said different intensities, forming a screen of said negative and positive strip forms, reproducing each of said negative and positive strip forms of said trial transparencies into corresponding trial strips of various monochromatic colors by screen printing an appropriate color through said screens; superimposing said negative and positive trial strips one on the other for viewing any predetermined combination of superposed images thereon for the selection of a desired final composition of said superposed images, forming a full scale screen from the appropriate full scale duplicate corresponding to the polarity and intensity of the respective trial transparencies images defining the previsualized final composition and successively screen printing the appropriate color onto a foundation sheet through said full scale screen of the polarity and intensity corresponding to said trial transparencies images defining said final composition.

8. The method of making a multicolored enlarged print from a subject transparency of an image which includes the steps of making from the subject transparency a negative transparency strip and a positive transparency strip, each containing a plurality of relatively small trial transparencies of said image in varying intensities, forming a printing screen from each of said transparency strips, using said printing screens for printing a plurality of trial strips, each having a series of monochromatic images of graduated intensity thereon, superposing said trial strips containing said monochromatic images of graduated intensities over a source of light with the images of the respective trial strips in depthwise registration, shifting the trial strips respectively longitudinally relative to one another until the images of the desired intensities and colors are brought into registration to form a desired composition formed of said superposed images, noting the intensities and colors of the respective images forming the desired compositions, making from the subject transparency a series of enlargements corresponding to the size of the multicolored enlarged print to be made wherein each enlargement has the intensity of the respective trial transparency forming the desired composition, using said enlargements to make a corresponding full size printing screen which corresponds to the intensity of said trial transparency formig said desired composition, and printing the appropriate color through said full size printing screen to form a print of said desired composition.

9. The method of making an enlarged multicolored silk screen print from a subject photographic transparency of one form which includes the steps of making from said transparency a series of trial, relative small transparencies of the opposite form having images of graduated intensities, and a series of full size transparencies substantially equal to that of the finished print to be made; said full size transparencies being made in two forms each form corresponding in intensity to said trial transparency, making from said opposite form of trial composition series of positive and negative trial transparencies, each of a size substantially smaller than that of the full size transparencies; assembling said trial transparencies in a row; making therefrom a strip of negative imaged transparencies of graded intensities and from the latter a strip of positive imaged transparencies of graded intensities; making from one of said imaged strips a positive imaged trial silk screen and from the other of said imaged strips a negative imaged trial silk screen; using each of said trial silk screens to print on a plurality of trial strips a plurality of colored trial images of graded intensities, each trial strip being printed with a printing medium conforming to one of the colors to appear in the full size silk screen print; superposing said trial strips with said colored imaged areas aligned over a light source, and moving said trial strips relatively longitudinally to realign the various colored imaged areas of said superposed trial strips until the desired artistic effect is obtained; observing the intensity and color of the trial images selected; for each intensity selected using the one of said first-named full size transparencies having the form, whether positive or negative, and intensity corresponding to the selected trial images; making therefrom one or more full size silk screens and using the latter to successively print a foundation sheet with printing media of the respective colors appearing on the trial images chosen.

* * * * *